United States Patent [19]

Hipps, Sr. et al.

[11] Patent Number: 4,935,329

[45] Date of Patent: Jun. 19, 1990

[54] NEGATIVE WORKING IMAGING PROCESS EMPLOYING PHOTOSENSITIVE MICROCAPSULES

[75] Inventors: Jesse Hipps, Sr., Miamisburg; T. Kay Kiser, Kettering; Lyudmila Feldman, Centerville, all of Ohio

[73] Assignee: The Mead Corporation, Dayton, Ohio

[21] Appl. No.: 200,985

[22] Filed: Jun. 1, 1988

[51] Int. Cl.$^5$ ............................ G03C 1/68; B05D 3/06
[52] U.S. Cl. .................................... 430/138; 430/253; 430/394; 430/945; 430/914; 428/402.2; 428/402.24; 503/214; 503/215
[58] Field of Search ............... 430/138, 253, 394, 914, 430/945; 428/402.2, 402.24; 503/214, 215

[56] References Cited

U.S. PATENT DOCUMENTS

| | | | |
|---|---|---|---|
| 3,380,825 | 11/1964 | Webers | 96/35.1 |
| 3,782,951 | 1/1974 | Lee | 96/86 P |
| 3,888,672 | 6/1975 | Lee | 96/35.1 |
| 4,269,933 | 5/1981 | Pazos | 430/291 |
| 4,399,209 | 8/1983 | Sanders et al. | 430/138 |
| 4,440,846 | 4/1984 | Sanders et al. | 430/138 |
| 4,587,194 | 5/1986 | Adair et al. | 430/502 |
| 4,751,102 | 6/1988 | Adair et al. | 430/339 |
| 4,816,368 | 3/1989 | Skaggs | 430/138 |
| 4,816,371 | 3/1989 | Wright et al. | 430/138 |

Primary Examiner—Paul R. Michl
Assistant Examiner—Patrick A. Doody
Attorney, Agent, or Firm—Thompson, Hine and Flory

[57] ABSTRACT

A method for producing images utilizing photohardenable microcapsules and a reversal phenomenon is disclosed. The microcapsules contain a color former, a photopolymerizable or cross-linkable monomer and a photoinitiator. A substrate containing the microcapsules is image-wise exposed to a high intensity, short term exposure of actinic radiation to cause reversal in the exposed microcapsules. The substrate is then given an overall exposure to polymerize the microcapsules which had not completely reversed. The microcapsules are then ruptured in the presence of a developer material to produce a negative image. In addition the inventive method may be used to produce copies by a "direct-write" copying process.

18 Claims, 1 Drawing Sheet

NEGATIVE WORKING IMAGING PROCESS EMPLOYING PHOTOSENSITIVE MICROCAPSULES

BACKGROUND OF THE INVENTION

1. Field of the Invention

The present invention relates to a negative working imaging process employing photosensitive microcapsules. More particularly, the present invention utilizes a reversal phenomenon and two exposure steps to actinic radiation to enable the production of negative images from photosensitive microcapsules.

2. Description of the Prior Art

Photosensitive imaging systems employing microencapsulated radiation sensitive compositions are the subject of commonly assigned U.S. Pat. Nos. 4,399,209 and 4,416,966 to The Mead Corporation as well as copending U.S. patent application Ser. No. 320,643 filed Jan. 18, 1982. These imaging systems are characterized in that an imaging sheet including a layer of microcapsules containing a photosensitive composition in the internal phase is image-wise exposed to actinic radiation. In the most typical embodiments, the photosensitive composition is a photopolymerizable composition including a polyethylenically unsaturated compound and a photoinitiator and is encapsulated with a color precursor. Image-wise exposure hardens the internal phase of the microcapsules. Following exposure, the imaging sheet is subjected to a uniform rupturing force by passing the sheet through the nip located between a pair of pressure rollers.

U.S. Pat. No. 4,399,209 discloses a transfer system in which the imaging sheet is assembled with a developer sheet prior to being subjected to the rupturing force. Upon passing through the pressure rollers in contact with the developer sheet, the microcapsules rupture and image-wise release the internal phase whereupon the colorformer migrates to the developer sheet where it reacts with a dry developer and forms a color image. The imaging system can be designed to reproduce monochromatic or polychromatic full color images.

U.S. Pat. No. 4,440,846 discloses a so called "self-contained" imaging system wherein both the image-forming agent and the developer material are located on the same substrate. In the system according to U.S. Pat. No. 4,440,846, the image-forming agent is encapsulated in a layer of pressure rupturable capsules, and the subsequent exposure and capsule rupture causes the image-forming agent to contact and react with the developer to produce an image on the substrate.

The imaging materials and processes described in the aforementioned references are by nature positive-working (i.e., the image produced is an exact copy of the original image). It would be desirable to design an imaging system employing photosensitive microcapsules which are negative working. In such a system, the image produced would be a complete inversion of the original image. For example, it would be desirable to produce high quality negative image copies of originals such as microfilm and microfiche which, are by nature, "negative-type" originals.

Several methods have been proposed to produce negative images.

One method described in the aforementioned publications is to incorporate a photosoftenable or photodepolymerizable material in the microcapsules. Although such a system does produce negative images, the system has been difficult to commercially implement.

In silver-halide photographic systems, reverse image processes are well known. They may take the form of several methods, including the bleach/re-expose technique and transfer diffusion procedures. Such a system does not utilize photopolymerizable microcapsules.

Another way to produce negative images is to utilize a photopolymerizable composition containing a nitroaromatic compound which may be converted to a photoinhibitor. The formed photoinhibitor acts to prevent photopolymerization of an ethylenically unsaturated compound capable of addition polymerization by free-radical initiated chain propogation. The inhibitor is produced by exposure of the composition to actinic radiation of a designated wavelength for a designated time period. Such a system is disclosed in U.S. Pat. No. 4,269,933.

In the context of a photohardenable or photopolymerizable system, a negative image may be produced wherein the areas of a photosensitive layer corresponding to the dark or opaque areas of the original are photohardened, while the areas corresponding to the light or transparent areas of the original are not substantially photohardened. The negative images are obtained by utilizing a reversal process. Such a process has not been disclosed with use in connection with photosensitive microcapsules.

For a photosensitive composition, sensitomeric behavior is represented graphically by an H&D curve. FIG. 1 is a typical H&D curve depicting the behavior of a positive working system. As seen in FIG. 1, the density of the image decreases with increasing exposures. By comparison, an H&D curve for a photosensitive material which exhibits reversal on a similar exposure scale is depicted in FIG. 2. In this system, the H&D curve contains two distinct portions: a first, "positive" area where the system obeys the behavior as shown in FIG. 1, and a second "negative" area where the density of the image increases with increasing exposure.

In such a system as shown in FIG. 2, positive or negative images can be produced depending on how the exposure intensities and exposure times are manipulated. When desiring to produce negative images, the process steps are controlled so that only the "negative" portion of the H&D curve is utilized.

For example, U.S. Pat. No. 3,380,825 discloses a reverse-image process employing photohardenable compositions in the photosensitive layer. This process includes a first image-wise exposure under such conditions that a gaseous polymerization inhibitor exhausts the photoinitiator that had been excited by actinic radiation in the exposed areas before any substantial polymerization had occurred. The photosensitive layer is then shielded from the gaseous inhibitor during a second, nonimage-wise exposure to the same source of actinic radiation. Polymerization occurred only in those areas where the photoinitiator was not exhausted by the first image-wise exposure. Implementation of this process on a commercial scale has been unsuccessful due to the careful and inconvenient manipulations that are required to produce reverse images of excellent quality.

U.S. Pat. Nos. 3,782,951 and 3,888,672 disclose a photopolymerizable process capable of yielding a reverse image. The process includes utilizing a photopolymerizable composition containing an ethylenically unsaturated monomer, an organic polymeric binder, and, as an initiator system, a lophine dimer and a hydrogen-donor compound. The composition is subjected to a first, intense image-wise exposure and then a second, nonimage-wise, less intense exposure. By utilizing this process, negative images are produced. The images are produced as a result of utilizing the so-called reversal phenomenon whereby the first exposure step deactivates the photopolymerizable composition in the image-wise exposed areas. Success of this process is dependent upon five variables. These variables are: concentrations of hydrogen-donor compounds, lophine dimer, ethylenically unsaturated monomer, and organic polymeric binder, and the intensity of exposure. Accordingly, production of good quality negative images requires manipulation of the above-mentioned five variables.

Accordingly, there exists a need in the art for producing negative images by utilizing the reversal phenomenon in conjunction with photopolymerizable microcapsules.

In addition, when producing copied images by utilizing a positive-working system employing photosensitive microcapsules, it is necessary to selectively expose the background areas of the imaging sheet to prevent unwanted image formation on the developer sheet. A negative-working system would be more desirable than a positive-working system since the image-wise exposure step would only be required in the areas in which images are to be produced. Such a system is referred to in the art as a "direct-write" system and is particularly useful for producing photocopies from originals containing only written text. A direct-write system has not been developed which utilizes photosensitive microcapsules and the reversal phenomenon.

Accordingly, there exists a need in the art for a direct-write copying system utilizing photosensitive microcapsules.

DEFINITION

The term "reversal time" refers to the exposure time for a given exposure (E) (where E = Intensity (I) x Time (T)) below which the photosensitive material is unable to reach $D_{min}$. At exposure times greater than the reversal time for a given exposure (I x T), the photosensitive material obeys reciprocity and does not exhibit reversal. In accordance with the present invention, increases in intensity for exposure time periods less than the reversal time produces proportional increases in image density.

SUMMARY OF THE INVENTION

In accordance with the present invention, a negative working imaging process employing photosensitive microcapsules is provided. The process advantageously utilizes the reversal phenomenon.

In accordance with the present invention, the substrate containing photohardenable microcapsules is subjected to two exposures to actinic radiation. The first exposure is an image-wise exposure step of short duration having a high intensity. The high intensity short exposure step functions to reverse or desensitize the photopolymerizable characteristics of the microcapsules in the areas of exposure such that the internal phase of the microcapsules cannot harden. A second, overall exposure causes the microcapsules which did not completely reverse as a result of the image-wise exposure step to harden. Moreover, because of the sensitometric behavior of the composition as shown in FIG. 2, it is possible to produce images from microcapsules which are partially or totally reversed.

In accordance with one embodiment of the present invention, the process includes the steps of providing a first substrate having coated on at least one of its surfaces a layer of microcapsules. The microcapsules contain a color-forming agent and a photohardenable composition comprising a free radical addition polymerizable or cross-linkable compound and a photoinitiator capable of absorbing actinic radiation and producing free radicals which initiate free radical polymerization or cross-linking of the polymerizable or cross-linkable compound. The photohardenable composition is further characterized in that it will undergo reversal or become proportionally desensitized upon exposure to high intensity radiation. The substrate is first image-wise exposed to actinic radiation of sufficiently high intensity to cause reversal in the photohardenable composition in the exposed areas, and then uniformly exposed to lower intensity actinic radiation to harden the photohardenable composition which did not completely reverse as a result of the image-wise exposure step. The microcapsules are then subjected to a uniform rupturing force to produce an image.

In another embodiment, the present invention relates to a method for producing full color images. The method includes the steps of providing a substrate having on at least one of its front or back surfaces a coating comprising a first set of microcapsules including a first image-forming agent and a photohardenable composition having a first sensitivity associated with said first image-forming agent, a second set of microcapsules including a second image-forming agent and a photohardenable composition having a second sensitivity associated with said second image-forming agent, and a third set of microcapsules including a third image-forming agent and a photohardenable composition forming agent, said first, second and third photohardenable compositions undergoing reversal upon exposure to high intensity radiation;

selectively image-wise exposing said three sets of microcapsules to three bands of actinic radiation of sufficiently high intensity to cause reversal in said photohardenable compositions in the exposed areas, said three bands of actinic radiation corresponding to said first, second and third sensitivities;

uniformly exposing said substrate to actinic radiation to harden said photohardenable compositions in each of said three sets of microcapsules which did not completely reverse as a result of the image-wise exposure step; and subjecting said microcapsules to a uniform rupturing force in the presence of a developer material to produce an image.

Accordingly, it is an object of the present invention to provide a method for producing a negative image from photosensitive microcapsules.

It is a further object of the present invention to produce negative images from photosensitive microcapsules by utilizing a reversal technique.

A further object of the present invention is to produce negative images by subjecting a substrate containing photosensitive microcapsules to two exposure steps, a short high intensity image-wise exposure step, and an overall uniform exposure step.

It is yet a further object of the present invention to utilize commercially available light sources, such as lasers for image-wise exposing a layer of photosensitive microcapsules for a short period of time.

It is an additional object of the present invention to produce a resultant positive image from a "negative image" original, such as photographic negatives, microfilm and microfiche.

An additional object of the present invention is to produce negative images from photosensitive microcapsules in a transfer imaging system.

Another object of the present invention is to produce negative images from photosensitive microcapsules in a self-contained imaging system.

It is yet a further object of the present invention to provide a process for making photocopies utilizing a direct-write system.

These, and other objects will be readily recognized and understood by one skilled in the art as reference is made to the following detailed description of the preferred embodiments.

DETAILED DESCRIPTION OF THE PREFERRED EMBODIMENTS

Figure 1:
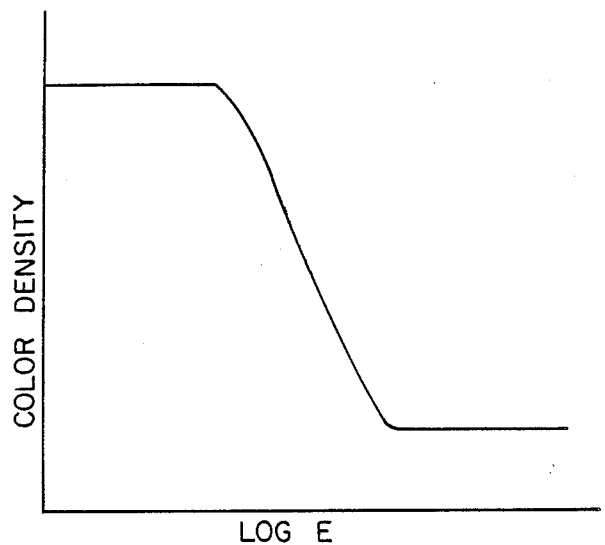
FIG. 1 is an H&D curve of a positive working photosensitive composition.
Figure 2:
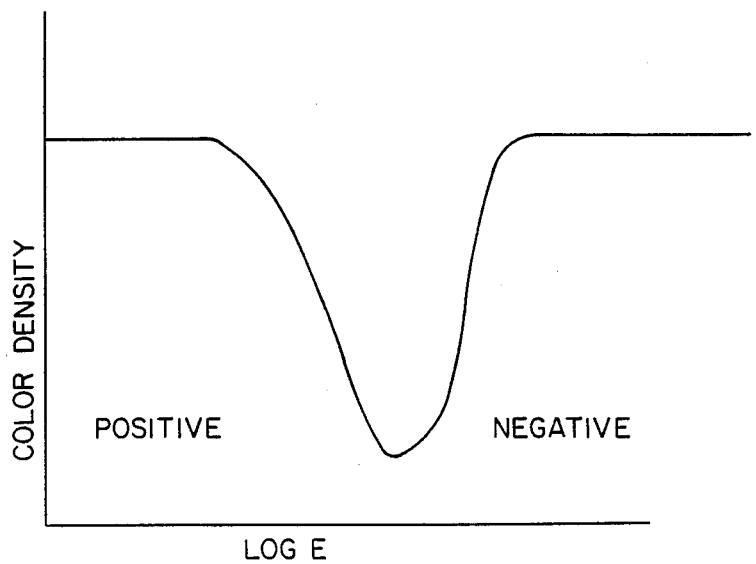
FIG. 2 is an H&D curve of a photosensitive composition showing its positive and negative imaging characteristics.

While describing the preferred embodiments, specific terminology will be utilized for the sake of clarity. It is to be understood that such terminology includes not only the recited embodiments, but all technical equivalents which perform substantially the same function in substantially the same way to obtain the same result.

To initiate the process according to the present invention, an imaging sheet must be provided. The imaging sheet has on one of its surfaces a layer of microcapsules coated thereon. The microcapsules contain a photohardenable composition including a radiation curable composition and a photoinitiator. Photohardenable compositions such as photopolymerizable and photocross-linkable materials increase in viscosity or solidify upon exposure to radiation. In association with the microcapsules is an image-forming agent.

Various radiation sensitive materials, photoinitiators and image-forming agents can be used in conjunction with the photographic materials of the present invention to produce negative images by a reversal technique.

Ethylenically unsaturated organic compounds are useful radiation curable materials. These compounds contain at least one terminal ethylene group per molecule. Typically, they are liquid. Polyethylenically unsaturated compounds having two or more terminal ethylene groups per molecule are preferred. An example of this preferred subgroup is ethylenically unsaturated acid esters of polyhydric alcohols, such as trimethylol propane triacrylate (TMPTA) and dipentaerythritol hydroxypentaacrylate (DPHPA).

The reversal phenomenon is not completely understood and is believed to involve a combination of interactions as discussed in more detail below. Further, the reversal phenomenon varies widely among photosensitive compositions. Some compositions reverse at very short times, some of which may be too short to be useful with present technology, whereas other compositions exhibit longer reversal times and can be used with present technology. The ability of an internal phase to exhibit a reversal phenomenon is largely dependent upon the type of monomer used and the type and concentration of photoinitiator used in the internal phase.

Presently, it is necessary to identify photohardenable compositions which possess relatively long reversal times and particularly initiators on a trial and error basis from groups of known free radical initiators.

A preferred photoinitiator system for use in the present invention includes ionic dye-counter ion compounds described in European Application Publication No. 0 233 587. A preferred class of ionic dye-counter ions is cationic dye borates and still more particularly cyanine dye borates. Typically the borate is a triphenylalkyl borate such as a triphenylbutyl borate. Other dye complexes such as Rose Bengal iodonium and Rose Bengal pyryllium complexes may also be used.

Examples of other photoinitiators potentially useful in the present invention may be selected from among diaryl ketone derivatives, quinones, benzoin alkyl ethers, alkoxy phenyl ketones, O-acylated oximinoketones, polycyclic quinones, phenanthrenequinone, naphthoquinone, diisopropylphenanthenequinone, benzophenones and substituted benzophenones, xanthones, thioxanthones, halogenated compounds such as chlorosulfonyl and chloromethyl polynuclear aromatic compounds, chlorosulfonyl and chloromethyl heterocyclic compounds, chlorosulfonyl and chloromethyl benzophenones and fluorenones and haloalkanes. In many cases it is advantageous to use a combination with imaging photoinitiators.

Initiators including the ionic dye complexes may preferably include an autoxidizer. Suitable examples include N,N,-dialkylanilines as described in the European Publication.

Various image-forming agents can be used in association with the radiation curable composition. For example, images can be formed by the interaction of color formers and color developers of the type conventionally used in the carbonless paper art. In addition, images can be formed by the color producing interaction of a chelating agent and a metal salt or by the reaction of certain oxidation-reduction reaction pairs, many of which have been investigated for use in pressure-sensitive carbonless papers. Alternatively, an oil soluble dye can be used and images can be formed by transfer to plain or treated paper. The internal phase itself has its own image-forming capability. For example, it is known that many of the toners used in xerographic recording processes selectively adhere to the image areas of an imaging sheet exposed and developed as in the present invention.

Furthermore, the image-forming agent can be provided inside the microcapsules, in the microcapsule wall, or outside the microcapsules in the same layer as the microcapsules or in a different layer. In the latter cases, the internal phase picks up the image-forming agent (e.g., by dissolution) upon being released from the microcapsules and carries it to the developer layer or an associated developer sheet.

Typical color precursors useful in the aforesaid embodiments include colorless electron donating type compounds. Representative examples of such color formers include substantially colorless compounds having in their partial skeleton a lactone, a lactam, a sulfone, a spiropyran, an ester or an amido structure such as triarylmethane compounds, bisphenylmethane compounds, xanthene compounds, fluorans, thiazine compounds, spiropyran compounds and the like. Crystal Violet Lactone and Copikem X, IV and XI (products of Hilton-Davis Chemical Co.) are often used alone or in combination as color precursors in the present invention, as are commercially available cyan, magenta and yellow color forming agents.

The discrete walled microcapsules used in the present invention can be produced using known encapsulation techniques including coacervation, interfacial polymerization, polymerization of one or more monomers in an oil, etc. Representative examples of suitable wall-formers are gelatin materials (see U.S. Pat. Nos. 2,730,456 and 2,800,457 to Green et al.) including gum arabic, polyvinyl alcohol, carboxy-methyl-cellulose; resorcinol-formaldehyde wall formers (see U.S. Pat. No. 3,755,190 to Hart et al.); isocyanate wall-formers (see U.S. Pat. No. 3,914,511 to Vassiliades); isocyanate-polyol wall-formers (see U.S. Pat. No. 3,796,669 to Kiritani et al.); urea-formaldehyde wall-formers, particularly urea-resorcinol-formaldehyde in which oleophilicity is enhanced by the addition of resorcinol (see U.S. Pat. Nos. 4,001,140; 4,087,376 and 4,089,802 to Foris et al.); and melamine-formaldehyde resin and hydroxypropyl cellulose (see commonly assigned U.S. Pat. No. 4,025,455 to Shackle). A melamine-formaldehyde capsule is particularly preferred.

The mean microcapsule size used in the present invention generally ranges from about 1 to 25 microns.

The most common substrate for imaging sheets in accordance with this invention is a transparent film or paper. The paper may be a commercial impact raw stock, or special grade paper such as cast-coated paper or chrome-rolled paper. The latter two papers are preferred when using microcapsules having a diameter between approximately 1 and 5 microns because the surface of these papers is smoother and therefore the microcapsules are not as easily embedded in the stock fibers. Transparent substrates such as polyethylene terephthalate and translucent substrates can also be used in this invention. Another preferred substrate for the microcapsules is aluminized Mylar (PET). The microcapsules can be located on either the top or bottom surface of a transparent substrate or on both the top and bottom surfaces to form an imaging sheet.

To initiate the reversal effect, the substrate is imagewise exposed to high intensity radiation for a short period of time. Exposure conditions will vary with the nature of the photohardenable composition. If the exposure intensity is not high enough, the composition may polymerize instead of reverse. The exposure may include wavelengths in the ultraviolet spectral region, visible region, and infrared spectral region. Accordingly, the radiation source and the length of exposure should be selected to cause the photosensitive composition to reverse. A typical intensity of exposure exceeds 2000 ergs/cm$^2$ and may range from 1000 ergs/cm$^2$ to 32000 ergs/cm$^2$. Further, the exposure time ranges from microseconds to seconds. In a preferred embodiment, commercially available lasers or other high intensity light sources which emit light in the ultraviolet or visible spectrums are used as the source of the first exposure step.

As a result of the first image-wise exposure, reversal or desensitization occurs in the areas of the substrate which were exposed to radiation. More specifically, the microcapsules which are fully subjected to image-wise exposure do not harden and become unhardenable.

In the present invention, the reversal can only occur if the photohardenable composition includes a photoinitiator and a polymerizate monomer. A number of theories regarding the reversal phenomenon have been proposed. While not wanting to be bound by any particular theory, it is hypothesized that the short term high intensity radiation exposure causes termination to occur at a faster rate than propagation in the image-wise exposed areas with a result of the photoinitiator being depleted in the microcapsules before the monomer has had an opportunity to polymerize. Another theory speculates that a polymerization inhibitor or a radical scavenger is created in the microcapsules.

It has further been discovered that by optimizing the concentration and amount of monomer and initiator, the radiation source and the time of exposure, the photosensitive composition may reverse partially or completely. When looking at a H&D curve for a photosensitive composition that undergoes reversal, the density of the image decreases with exposure until the reversal region of the curve is reached (i.e., until the reversal region is reached, the density of the image is inversely related to the exposure). In the reversal region as seen on the H&D curve the image density is directly proportional to the amount of exposure received (i.e., density increases with increased exposure). As exposure is a direct product of intensity and time, a radiation source or exposure time can be selected to produce any image density in the reversal region ranging from no reversal (i.e., complete polymerization) to reversal (i.e., complete termination). In the region where the photosensitive material undergoes partial reversal, it is hypothesized that the partial reversal results from a partial, but not complete depletion of the initiator.

The substrate is then subjected to a uniform exposure to actinic radiation to harden the photohardenable composition which did not completely reverse. Any source capable of polymerizing the microcapsules which were not image-wise exposed may be used. The exposure may include wavelengths in the ultraviolet spectral region, visible region, and infrared spectral region. In a preferred embodiment, a tungsten halogen white light source may be utilized.

The length of time of the uniform exposure step is selected to complete photopolymerization in the areas which did not completely reverse.

After the uniform exposure step, the microcapsules on the substrate are subjected to a uniform rupturing force in the presence of a developer material to rupture the microcapsules and form a reverse image.

Where the image-forming agent is not a dye or pigment, a developer material is selected to react with the image-forming agent to form an image. Illustrative examples of color developers useful in conjunction with the embodiment employing the aforesaid color precursors are clay minerals such as acid clay, active clay, attapulgite, etc.; organic acids such as tannic acid, gallic acid, propyl gallate, etc.; acid polymers such as phenol-formaldehyde resins, phenol acetylene condensation resins, condensates between an organic carboxylic acid having at least one hydroxy group and formaldehyde, etc.; metal salts or aromatic carboxylic acids such as zinc salicylate, tin salicylate, zinc 2-hydroxynaphthoate, zinc 3,5-di-tert-butyl salicylate, oil soluble metal salts or phenol-formaldehyde novolak resins (e.g., see U.S. Pat. Nos. 3,672,935; 3,732,120 and 3,737,410) such as zinc modified oil soluble phenol-formaldehyde resin as disclosed in U.S. Pat. No. 3,732,120, zinc carbonate etc. and mixtures thereof. A preferred class of glossable developers is described in commonly assigned U.S. Application Ser. No. 073,036, filed July 14, 1987.

The developer material may be located on a support separate from the imaging sheet to thereby form a transfer image coating system. In such a system the imaging sheet and the developer sheet are brought together in the presence of a uniform rupturing force to cause the image-forming agent to migrate to the developer sheet and form an image on the developer sheet. The support may be made of paper, or a transparent film such as polyethylene terephthalate.

Alternatively, the developer material may be located on the same surface as the layer of microcapsules to form a self-contained sheet. In this configuration, the substrate is coated with a first coating of developer material and then a second coating of the photosensitive microcapsules. Alternatively, the microcapsules and developer material can be admixed and coated as a single layer as is readily understood in the art.

By performing the above-described method, negative images are produced on the substrate. The images are produced as a result of the photosensitive microcapsules of the imaging sheet corresponding to the white or transparent portions of the original image having released their contents whereas the microcapsules corresponding to the darkened areas of the original image not releasing their contents.

The inventors have further discovered that the reversal phenomenon can be influenced by certain parameters and, consequently, by controlling these parameters, processing conditions can be modified. For example, the time range for conducting the image-wise exposure step may be altered by altering process parameters.

The inventors have discovered that reversal time may be increased by increasing the temperature of the photosensitive material. By extending the time range, reversal may be more easily accomplished.

In an embodiment where a heating step is utilized prior to the image-wise exposure step, the substrate should be cooled to approximately ambient conditions before the uniform exposure step. Cooling of the substrate can be accomplished by any means well-known in the art, such as a fan.

The inventors have further discovered that the monomer composition may affect the reversal time. While not wishing to be bound by any particular theory, the inventors hypothesize that the viscosity of the internal phase of the microcapsules may bear a relationship to the reversal time. The inventors have discovered that when low viscosity monomers are used, the reversal time tends to be longer (and hence the composition tends to be more susceptible to reversal) than when high viscosity monomers are used. For example, if TMPTA is utilized as the primary monomer, if the reversal time of the system were desired to be lengthened to facilitate reversal processing, a polymerizable monomer having a lower viscosity than TMPTA could be added to the system. Alternatively, if a shorter reversal time were desired, a higher viscosity monomer could be added to the internal phase. Preferably, the photohardenable compositions used in the present invention exhibit a reversal time ranging from several nanoseconds to several seconds.

Because the present invention may be advantageously used to provide a negative-working system, the present invention may be used to produce copies in a direct-write process. This is particularly advantageous for making copies of original documents having contained thereon a limited amount of visible material on the sheet, for example, typewritten text. In a preferred embodiment, the image-wise exposure occurs by utilizing a laser as the source of actinic radiation. Because the path of the laser can be carefully controlled by means well known in the art, (e.g., computer control), a quite useful process is provided. This is particularly so in the case where the image to be reproduced primarily contains white or transparent regions. According to the inventive process, the corresponding regions of the substrate are subjected to a simple overall exposure step which causes the microcapsules to harden.

The present invention may be utilized to produce monochromatic or full color images. Full-color imaging systems are described in U.S. Pat. No. 4,576,891, European Published Application No. 0223587 and U.K. Pat. No. 2,113,860. These systems employ imaging sheets having three sets of microcapsules which respectively contain cyan, magenta and yellow color precursors. As explained in more detail in the above-listed references, each set of microcapsules is primarily sensitive in a different wavelength band such that the microcapsules can be individually exposed with minimum cross-talk. In panchromatic systems, the cyan, magenta, and yellow forming photosensitive microcapsules are respectively sensitive to red, green and blue light.

In accordance with the present invention, each of the three sets of microcapsules contains a photohardenable composition capable of reversal. Further, for each set of microcapsules, the composition selected is sensitive to a different wavelength band.

To produce full-color images, each set of microcapsules is respectively image-wise exposed to high intensity radiation to cause reversal in the respective image-exposed areas. This requires exposures of three different wavelengths, each wavelength corresponding to the sensitivity of the photohardenable composition selected for the corresponding set of microcapsules. The three different wavelengths may be provided from one broad band radiation source or three independent monochromatic radiation sources. In a panchromatic system, it is envisioned that green, blue, and red lasers be used for short term exposure steps. These processes rely upon image process techniques which are well known in the art. It is further contemplated that a high intensity white light source containing at least three bands of actinic radiation may be used for the short term exposures.

After short term exposure, the substrate is subjected to a uniform exposure step to harden the microcapsules which did not completely reverse. Thereafter, the substrate is brought into contact with a developer material, and the microcapsules are ruptured in the presence of the developer material to produce an image.

The invention is illustrated in more detail by the following non-limiting example:

EXAMPLE

The following composition was encapsulated in melamine-formaldehyde microcapsules and coated on three mil polyethylene terephthalate film:

| | |
|---|---|
| Trimethylolpropane triacrylate | 100 parts |
| Cyanine borate photoinitiator | .2 parts |
| Diisopropyl Dimethylamine | 6 parts |
| Cyan color former | 6 parts |
| Desmodur N-100 Isocyanates | 6.6 parts |

The coated substrate was heated to 50° C. The substrate was then image-wise exposed for four seconds through a 30 step density wedge using a 360 watt tungsten halogen source at a distance of about 19 centimeters to produce capsules that permanently fail reciprocity (reverse) in the high intensity regions (i.e., terminate at a faster rate than polymerize). The density wedge was removed and the substrate was quickly quenched to ambient conditions by using a cool air gun. The substrate was then uniformly exposed to a fluorescent tube/black light source for 12 seconds. This low intensity exposure polymerized the capsules which did not reverse upon the first exposure. The substrate was subjected to a uniform rupturing force in the presence of a developer sheet. The image produced was a negative image of the original image.

Having described the invention in detail and by reference to the preferred embodiments thereof, it will be apparent that modifications and variations are possible without departing from the scope of the appended claims.

What is claimed is:

1. A method for producing an imaging sheet capable of yielding reverse images comprising the steps of:
providing a substrate having coated on one of its surfaces a layer of microcapsules, said microcapsules containing an image-forming agent and a photohardenable composition comprising a free radical addition polymerizable or cross-linkable compound and a photoinitiator, said photoinitiator being capable of absorbing actinic radiation and producing free radicals which initiate free radical polymerization or cross-linking of said polymerizable or cross-linkable compound, said photoinitiator being selected from the group consisting of ionic dye-reactive counter ion compounds, diaryl ketone derivatives, quinones, benzoin alkyl ethers, alkoxy phenyl ketones, O-acylated oximonoketones, benzophenones, xanthones, thioxanthones, chlorosulfonyl and chloromethyl polynuclear aromatic compounds, chlorosulfonyl and chloromethyl heterocyclic compounds, chlorosulfonyl and chloromethyl fluorenones, and haloalkanes, and said photohardenable composition undergoing reversal upon exposure to high intensity radiation.

2. The method according to claim 1 wherein said photoinitiator comprises an ionic dye-reactive counter ion compound.

3. The method according to claim 2 wherein said ionic dye-reactive counter ion compound is a cationic dye-borate anion compound.

4. The method according to claim 1 comprising the additional step of heating said substrate to temperatures greater than ambient temperatures to increase the reversal time of said photohardenable composition.

5. The method according to claim 1 wherein said image-wise exposing step comprises exposing said substrate to light emitted from a laser.

6. The method of claim 5 wherein said photohardenable composition is sensitive to visible light.

7. The method according to claim 1 wherein said image-wise exposing step comprises exposing said substrate to actinic radiation having an intensity greater than about 2000 ergs/cm$^2$.

8. A method for producing images comprising the steps of:
providing a first substrate having coated on at lest one of its surfaces a layer of microcapsules, said microcapsules containing an image-forming agent and a photohardenable composition comprising a free radical addition polymerizable or cross-linkable compound and a photoinitiator, said photoinitiator being capable of absorbing actinic radiation and producing free radicals which initiate free radical polymerization or cross-linking of said polymerizable or cross-linkable compound, said photoinitiator being selected from the group consisting of ionic dye-reactive counter ion compounds, diarylketone derivatives, quinones, benzoin alkyl ethers, alkoxyl phenyl ketones, O-acylated oximonoketones, benzophenones, xanthones, thioxanthones, chlorosulfonyl and chloromethyl polynuclear aromatic compounds, chlorosulfonyl and chloromethyl heterocyclic compounds, chlorosulfonyl and chloromethyl fluorenones, and haloalkanes, and said composition exhibiting reversal upon exposure to high intensity radiation;
image-wise exposing said first substrate to actinic radiation of sufficiently high intensity to cause reversal in said photohardenable composition in the exposed areas;
uniformly exposing said substrate to actinic radiation to harden said photohardenable composition which did not completely reverse as a result of said image-wise exposing step;
providing a second substrate having coated on one of its surfaces a developer material capable of reacting with said image-forming agent to form an image on said second substrate; and
subjecting said microcapsules to a uniform rupturing force in the presence of said developer material such that said image-forming agent is image-wise transferred to said second substrate where an image is produced.

9. The method according to claim 8 wherein said photoinitiator comprises an ionic dye-reactive counter ion compound.

10. The method according to claim 9 wherein said ionic dye-reactive counter ion compound is a cyanine dye-borate anion compound.

11. The method according to claim 8 wherein said high intensity radiation is at least about 2000 ergs/cm$^2$.

12. The method according to claim 8 wherein said photohardenable composition is sensitive to visible light.

13. A method for producing full color images comprising the steps of:
providing a substrate having on at least one of its front or back surfaces a coating comprising a first set of microcapsules including a first image-forming agent and a photohardenable composition including a first photoinitiator having a first sensitivity associated with said first image-forming agent, a second set of microcapsules including a second image-forming agent and a photohardenable composition including a second photoinitiator having a second sensitivity associated with said second image-forming agent, and third set of microcapsules including a third image-forming agent and a photohardenable composition including a third photoinitiator having a third sensitivity associated with said third image-forming agent, said first, second, and third photoinitiators being different and being selected from the group consisting of ionic dye-reactive counter ion compounds, diarylketone derivatives, quinones, benzoin alkyl ethers, alkoxy phenyl ketones, O-acylated oximonoketones, benzophenones, xanthones, thioxanthones, chlorosulfonyl and chloromethyl polynuclear aromatic compounds, chlorosulfonyl and chloromethyl heterocyclic compounds, and chlorosulfonyl and chloromethyl fluorenones, and haloalkanes, said first, second and third photohardenable compositions undergoing reversal upon exposure to high intensity radiation;

selectively image-wise exposing said third sets of microcapsules to three bands of actinic radiation of sufficiently high intensity to cause reversal in said photohardenable compositions in the exposed areas, said three bands of actinic radiation corresponding to said first, second and third sensitivities;

uniformly exposing said substrate to actinic radiation to harden said photohardenable compositions in each of said three sets of microcapsules which did not completely reverse as a result of said image-wise exposing step; and subjecting said microcapsules to a uniform rupturing force in the presence of a developer material to produce an image.

14. The method according to claim 13 wherein said three image-forming agents comprise cyan color-forming, yellow color-forming, and magenta color-forming agents.

15. The method according to claim 14 wherein said image-wise exposing step comprises exposing said microcapsules to radiation emitted from three lasers.

16. The method according to claim 15 wherein said three lasers comprise a first laser emitting red light, a second laser emitting green light and a third laser emitting blue light.

17. The method according to claim 14 wherein said three bands of actinic radiation are provided by a high intensity white light source.

18. The method according to claim 13 wherein at least one of said photoinitiators comprises an ionic dye-reactive counter ion compound.

* * * * *